United States Patent [19]
Kawakami et al.

[11] Patent Number: 5,542,559
[45] Date of Patent: Aug. 6, 1996

[54] PLASMA TREATMENT APPARATUS

[75] Inventors: Satoru Kawakami, Sagamihara; Tsuyoshi Suzuki, Kawasaki; Junichi Arami, Tokyo-To; Yoichi Deguchi, Machida, all of Japan

[73] Assignee: Tokyo Electron Kabushiki Kaisha, Tokyo, Japan

[21] Appl. No.: 195,282

[22] Filed: Feb. 14, 1994

[30]  Foreign Application Priority Data

Feb. 16, 1993 [JP] Japan ................................. 5-049993
Feb. 20, 1993 [JP] Japan ................................. 5-055089

[51] Int. Cl.$^6$ ............................. C23F 1/02; C23C 16/00; C23C 14/34
[52] U.S. Cl. ................. 216/67; 156/646.1; 156/345; 118/723 E; 118/724; 118/728; 204/192.1; 204/298.07; 204/298.09; 204/298.15; 204/298.33; 427/569; 427/585
[58] Field of Search ........................ 156/345, 646; 118/723 R, 723 MW, 723 ME, 723 MR, 723 MA, 723 E, 723 ER, 723 I, 723 IR, 728, 724; 427/569, 573, 575, 585, 595; 204/298.07, 298.09, 298.15, 298.33, 192.1; 216/67

[56]  References Cited

U.S. PATENT DOCUMENTS

| | | | |
|---|---|---|---|
| 4,565,601 | 1/1986 | Kakehi et al. ................... | 156/643 |
| 4,668,365 | 5/1987 | Foster et al. ................... | 118/723 E |
| 4,771,730 | 9/1988 | Tezuka ........................... | 156/345 |
| 4,842,683 | 6/1989 | Cheng et al. ................... | 156/345 |
| 5,211,796 | 5/1993 | Hansen ........................... | 156/345 |
| 5,221,403 | 6/1993 | Nozawa et al. ................. | 156/345 |
| 5,270,266 | 12/1993 | Hirano et al. .................. | 156/345 |
| 5,290,381 | 3/1994 | Nozawa et al. ................. | 156/345 |

*Primary Examiner*—Nam Nguyen
*Assistant Examiner*—Rodney G. McDonald
*Attorney, Agent, or Firm*—Beveridge, DeGrandi, Weilacher & Young, LLP

[57]  ABSTRACT

In order to prevent any possible electrical discharge between a lower electrode and a grounded member through a backside gas supply conduit when performing a plasma treatment with a supply of a backside gas such as He gas to the backside of a semiconductor wafer being held by an electromagnetic chuck on the lower electrode for the generation of a plasma within a plasma treatment chamber, the gas supply conduit is fitted therein with cylindrical flowpath members made of two types of electrically insulating materials each having a multiplicity of axially extending small-diameter conduction holes, at a position within an electrically insulating body disposed between the lower electrode and a grounded member. The small diameter conduction holes in the backside gas flowpath serve to increase an electrical discharge start voltage for the prevention of electrical discharge. The formation of the multiplicity of conduction holes provides a large conductance. The backside gas is exhausted by way of the gas supply conduit after the completion of the plasma treatment. Consequently, water is prevented from remaining between the wafer and the electromagnetic chuck or within the treatment chamber, whereby it is possible to remove the electric charge the wafer and to shorten the time required for the exhausting of the treatment chamber.

16 Claims, 7 Drawing Sheets

PLASMA TREATMENT APPARATUS

BACKGROUND OF THE INVENTION

The present invention relates to a plasma treatment apparatus for subjecting an object to be treated, for example, a semiconductor wafer to a treatment such as film etching or film formation.

A plasma treatment is widely used in manufacturing processes for semiconductor wafers due to its high accuracy in process control. Plasma treatment apparatuses include a wafer-by-wafer treatment type and a batch type. A wafer-by-wafer etching apparatus, by way of example, comprises a vacuum treatment chamber, and upper and lower electrodes vertically confronting each other within the vacuum chamber. A semiconductor wafer is mounted on the lower electrode, and a high-frequency or RF (radio frequency) electric power is supplied between the two electrodes. In such a plasma treatment the wafer is required to be uniformity maintained at a predetermined temperature, and the apparatus therefore has, on the side of the lower electrode, temperature control means and means for supplying a heat transfer backside gas.

The known plasma treatment apparatus further comprises a grounded member which is provided below the lower electrode and is continuous with a wall of the vacuum treatment chamber by way of an electrically insulating member. The lower electrode is electrically connected to a RF power source while the grounded member is connected to the earth. The upper electrode is electrically connected to the grounded member, whereby an RF electric power can be applied between the upper and lower electrodes.

A gas supply conduit for a backside gas, made of an electrically insulating material is provided so as to extend from below the grounded member, that is, from below the vacuum treatment chamber, through the grounded member and electrically insulating member, to the underside of the lower electrode. The top end of the gas supply conduit communicates, via an accumulator passage and an accumulator space provided within the lower electrode, with a multiplicity of gas emission holes. Within the lower electrode there is also provided a cooling medium reservoir allowing passage of the cooling medium therethrough.

At the time of etching treatment, the wafer is attracted onto the lower electrode with the aid of an electrostatic chuck, and a backside gas, for example, He gas from the gas supply conduit is blown onto the backside of the wafer through the gas emission holes, thereby providing a uniform distribution of temperature over the wafer surface. After the completion of the etching, the electrostatic chuck is turned off, while simultaneously sucking the backslide gas through the gas supply conduit so as to prevent the wafer from being blown off by the pressure of the backside gas remaining within the gas supply conduit.

In the above-described etching apparatus, however, there was a fear of an electric discharge occurring between the lower electrode and the grounded member by way of the gas supply conduit for a reason which will be described later. The occurrence of such electric discharge makes it impossible to secure a predetermined electric power energy, which will lead to a reduction in the etching rate. Thus, unawareness of an electric discharge will result in an insufficient etching treatment. Further, unstabilized plasma may prevent a matching of the impedance, and due to the electric discharge a damage to the parts such as the gas supply conduit and electrically conducting sections will occur. It is to be appreciated that if the gas supply conduit is of small diameter to lower the voltage at which electric discharge occurs, the conductance will become small and it will take a considerable amount of time to suck the backside gas, thus resulting in a reduced throughput.

In this type of plasma treatment apparatus, the electrostatic chuck for holding an object to be treated such as a semicnductor wafer is provided with an electrostatic attraction sheet having a multiplicity of openings through which a backside gas, for example, He gas is supplied and filled between the object to be treated and the electrostatic attraction sheet. Such filling of the gas ensures a uniform heat transfer between the object to be treated and the electrostatic attraction sheet. This type of plasma treatment apparatus has the problems stated below, in particular, when a mount supporting the electrostatic chuck is cooled to restore the temperature within the treatment chamber to the room temperature from an ultra lower temperature at which the object to be treated undergoes a plasma treatment.

Within a tank as the source of supply of the backside gas, moisture may be mixed into the backside gas such as He gas to be filled between the object to be treated and the electrostatic sheet. This moisture is caused to return to the liquid phase as the temperature approaches the room temperature, the moisture having been condensed in the gas accumulation sparse and gas passage during the plasma treatment under low temperature conditions. As long as this liquid phase water remains on the inner wall surface of the gas accumulation space, there arises no problem. However, there is a large possibility for the liquid phase water to be emitted onto the attraction surface between the electrostatic chuck and the object to be treated. Thus, in the case of the liquid phase water depositing on the attraction surface, there occurs a residual electric charge on the surface of the electrostatic chuck under the influence of the presence of hydroxyl groups ($OH^-$, $OH^+$) involved in the water. The occurrence of the residual electric charge on the electrostatic chuck will naturally induce a residual electric charge on the object to be treated immediately confronting and abutting against the electrostatic chuck.

It is therefore necessary when unloading the object to be treated that any such residual electric charge and any electric charge remaining after the induction by the application of voltage to the electrostatic chuck be eliminated to assist in unloading the object to be treated. To this end, the elimination of the electric charge has hitherto been effected when pushing up the object to be treated by pusher pins which are commonly used in this type of apparatus and which serve as grounded members.

In case there exists a large amount of residual charge, however, the above constitution will result in an increase in the number of times by which the object to be treated is pushed up by the pins. Accordingly, it takes a considerable time to complete the unloading of the object to be treated, resulting in a poor throughput. Apart from this, there is a fear of damaging or impairing the surface of the object to be treated with increased number of times of the push up. Furthermore, the presence of the hydroxyl groups will induce a deposition of an unnecessary oxide film on the surface of the semiconductor wafer, which brings about unfavorable results in view of the characteristics of the semiconductor wafer.

In the case of filling a gas such as He gas, a uniform heat transfer can be accomplished between the electrostatic chuck and the object to be treated, whereas such gas may possibly leak from the filling space to the exterior. Should leakage occur, liquid phase water which is produced upon the return to the room temperature and contained in the gas will be scattered within the plasma treatment chamber or will adhere to the wall surface thereof.

Thus, when evacuating the interior of the plasma treatment chamber, removal must be performed of the filling gas which has leaked out as well as the liquid phase water which has been produced with the return to the room temperature, which inevitably elongates the time taken for the evacuation. An incomplete removal of the water will adversely affect the conditions of the plasma treatment to be subsequently executed.

SUMMARY OF THE INVENTION

The present invention was conceived to solve the above problems, and its major object is to provide a plasma treatment apparatus free from any electrical discharge through a flow path for a backside gas which is supplied to an object to be treated.

It is another object of the present invention to provide a plasma treatment apparatus and method, capable of shortening the time required for the evacuation after the plasma treatment, and suppressing the generation of a residual electric charge to prevent any damage or breakage of the object to be treated.

According to a first aspect of the present invention, there is provided a plasma treatment apparatus comprising means constituting a vacuum treatment chamber; an upper electrode and a lower electrode located within the vacuum treatment chamber so as to vertically confront each other; means for supplying and exhausting a treatment gas into and from the vacuum treatment chamber; a chuck provided on the lower electrode for holding an object to be treated; high-frequency electric power supply means for supplying a high-frequency electric power between the upper and lower electrodes to generate in the treatment gas a plasma for treating the object being held by the chuck; electrically conducting means associated with the lower electrode by way of electrically insulating means, the electrically conducting means having a potential different from that of the lower electrode; backside gas supply means including a gas supply conduit for supplying a heat transfer backside gas, through the electrically conducting means and the electrically insulating means, to a backside of the object to be treated being held by the chuck on the lower electrode; and flowpath means made of an electrically insulating material and fitted in the gas supply conduit, the flowpath means having a multiplicity of conduction holes having a small diameter.

The above feature ensures maintaining a uniform temperature over an object to be treated by subjecting a backside of the object to the backside gas during the plasma treatment of the object. Since the diameter of the gas flow paths is small between the electrically conducting member and the lower electrode, the voltage required for the initiation or start of the electrical discharge is increased, which prevents a possible electric discharge through these gas flow paths. The provision of a multiplicity of gas flow paths having a small diameter allows a large conductance, which enables a prompt evacuation in the case of the evacuation through these gas flow paths. Further, in the case where the gas flowpath means is divided into a plurality of flow path members, pressure resistance, conductance and so on can be varied depending on combinations thereof.

In the plasma treatment apparatus according to the present invention, the backside gas supply means may include supply pump means for supplying a backside gas onto the backside of the object to be treated by way of the gas supply conduit, exhaust pump means for exhausting a backside gas from the backside of the object to be treated by way of the gas supply conduit, and means for actuating the supply pump means in relation to the operation of the high-frequency electric power supply means and for actuating the exhaust pump means in relation to the completion of the operation of the high-frequency electric power supply means.

, By virtue of the above feature, a backside gas is exhausted from the backside of the object to be treated after the plasma treatment while simultaneously removing water contained in the gas. This lightens the work to remove the backside gas and the water when evacuating the interior of the vacuum treatment chamber.

According to the second aspect of the present invention, there is provided a plasma treatment method comprising the steps of placing an object to be treated on a chuck provided on a lower electrode within a vacuum treatment chamber, and thereby chucking the object; introducing a treatment gas into the vacuum treatment chamber; supplying a high-frequency electric power between an upper electrode and the lower electrode within the vacuum treatment chamber to produce in the treatment gas a plasma to thereby plasma treat the object; supplying a heat transfer backside gas through the lower electrode to a backside of the object being chucked on the lower electrode, during the plasma treatment; exhausting the backside gas from the backside of the object to be treated, after completion of the plasma treatment; and evacuating the vacuum treatment chamber of the treatment gas.

The above method enables a complete removal of the backside gas and the water mixed therewith at the time when the vacuum treatment chamber is evacuated, which serves to shorten the time required for the evacuation.

DESCRIPTION OF THE PREFERRED EMBODIMENTS

Preferred embodiments of the present invention will now be described with reference to the accompanying drawings.

Figure 1:
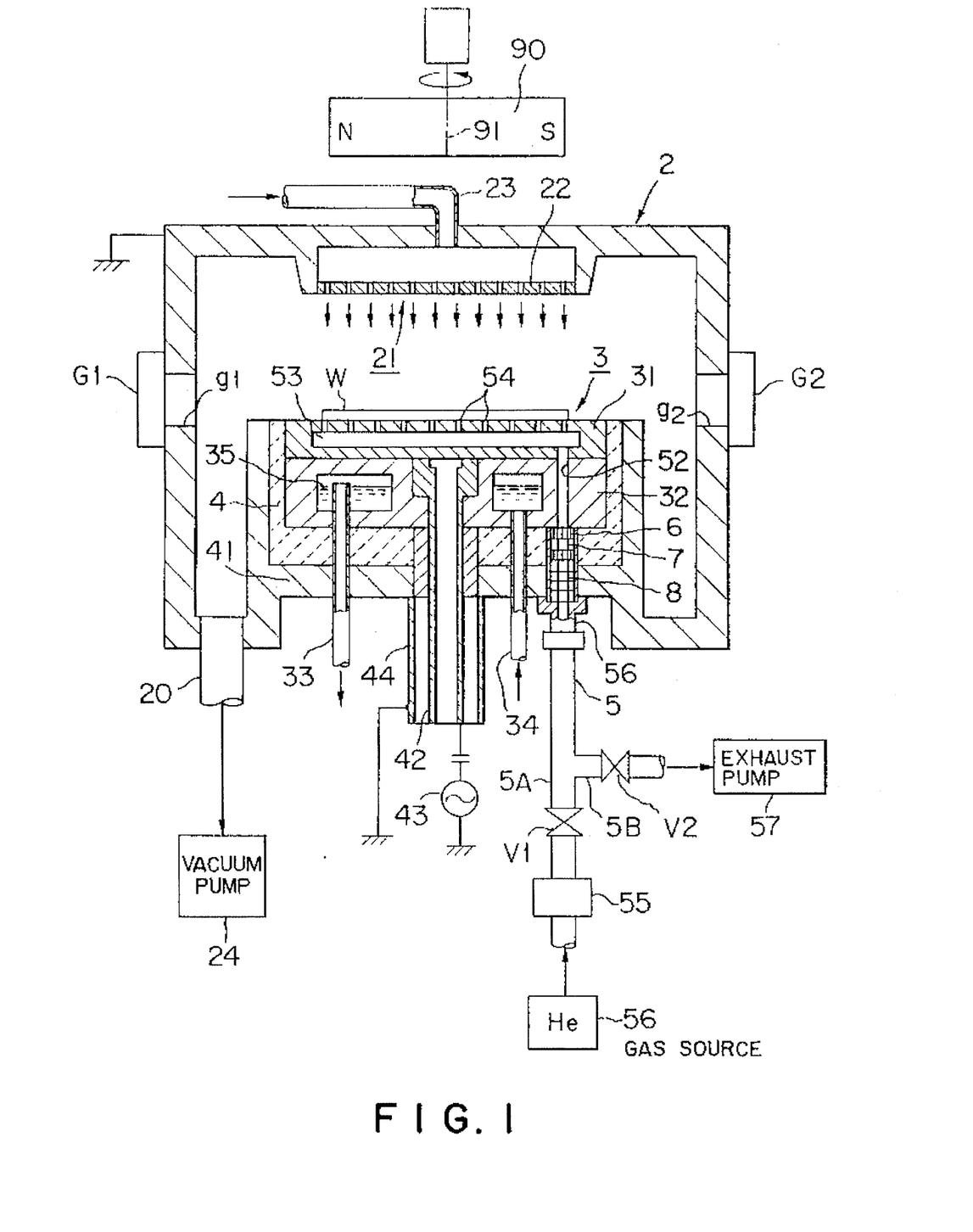
FIG. 1 is a vertical sectional view of a plasma treatment apparatus constructed in accordance with the present invention.

Referring to FIG. 1 which depicts the entire configuration of a plasma treatment apparatus embodying the present invention, there is shown a vacuum treatment chamber generally designated by reference numeral 2. The vacuum treatment chamber 2 includes a sidewall having on its opposite side surfaces gate valves G1 and G2 for openably closing wafer loading/unloading ports g1 and g2, respectively. The chamber 2 has a bottom with an exhaust conduit 20 which is coupled to a vacuum pump 24 for exhausting. The chamber has a top provided with an upper electrode 21 serving also as a treatment gas supply section. The electrode 21 has a gas ejection plate 22 with a multiplicity of ejection holes through which a treatment gas from a treatment gas supply conduit 23 is introduced into the vacuum treatment chamber 2 in the direction as indicated by arrows.

The vacuum treatment chamber further includes a lower electrode 3 serving as a susceptor and located below the upper electrode 21 in vertically confronting relation with the electrode 21. The lower electrode 3 is made of a metal such as aluminum, and divided into an upper wafer mount 31 and a support 32 underlying the mount 31. The upper surface of the mount 31 is provided with a known electrostatic chuck not shown.

The support 32 has a cooling medium reservoir 35 formed therewithin for circulation of a cooling medium, for example, liquid nitrogen by way of a cooling medium supply conduit 34 and a discharge conduit 33. The side and bottom of the lower electrode 3 are covered with an electrically insulating member 4 made of, for example, ceramics. Furthermore, the side and bottom of the electrically insulating member 4 are covered with a grounded member 41 made of, for example, aluminum and forming a part of the wall of the vacuum treatment chamber 2.

The lower electrode 3 is electrically connected via an internal conductive rod 42 to a high-frequency power source 43 lying below the vacuum treatment chamber 2, while the grounded member 41 is connected to the earth by way of an external conductive pipe 44 surrounding the internal conductive rod 42.

Figure 2:
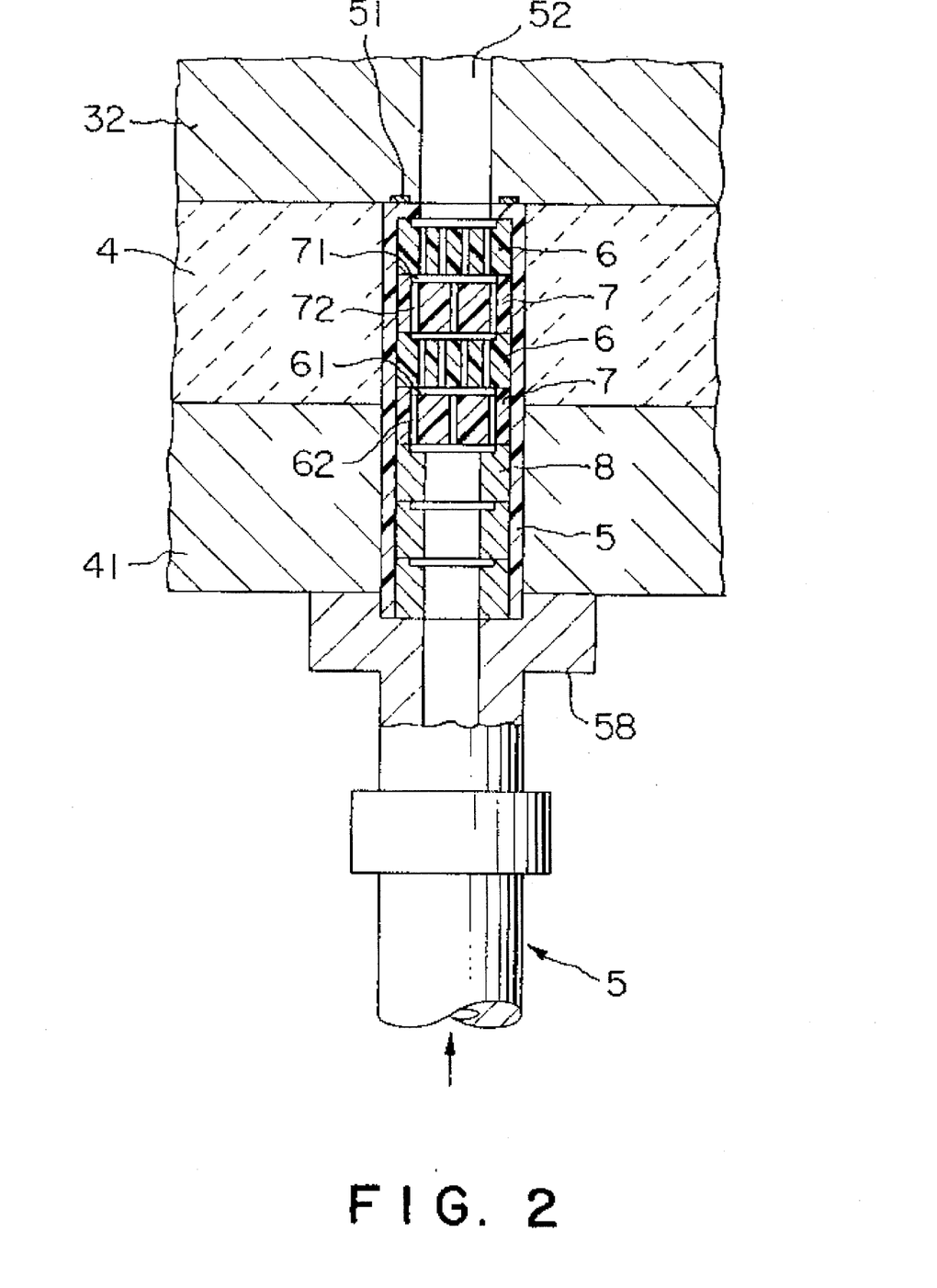
FIG. 2 is an enlarged sectional view of a part of the apparatus shown in FIG. 1.

From below the vacuum treatment chamber 2 extends upward a backside gas supply conduit 5 for a heat transfer backside gas, formed of a pipe of polytetrafluoroethylene (Teflon, brand name of E. I. Du Pont de Nemours & Co. Inc.) so as to pass through the grounded member 41 and the electrically insulating member 4, the upper end of the gas supply conduit 5 being joined to the lower surface of the support 32 through an O-ring 51 as shown in FIG. 2. The flow path of the gas supply conduit 5 communicates at its upper end with a gas flow path 52 formed within the support 32, the gas flow path 52 communicating via an accumulator space 53 formed within the mount 31 with a multiplicity of gas emission holes 54 opening into the upper surface of the mount 31 as shown in FIG. 1.

The gas supply conduit 5 has two branches on the side of its lower end. A branch conduit 5A on one hand is coupled via a valve V1 to a pressure control unit 55, and further to an upstream supply source 56 for a backside gas, for example, He gas. The other branch conduit 5B is intended to exert a suction to the upper side of the mount 31 through the gas supply conduit 5 as will be described later, and is coupled via a valve V2 to an exhaust pump 57. In FIG. 2, reference numeral 58 denotes a joint for joining together the inside and outside conduits of the vacuum treatment chamber 2.

The gas supply conduit 5 has at its portion located within the electrically insulating member 4 a first flowpath member 6, a second flowpath member 7, and a third flowpath member 8 fitted thereinto. The three flowpath members are each of a length of 10 mm or less and provided with a multiplicity of flow paths having small diameters. The flowpath members 6 to 8 and combinations thereof will be described in detail with reference to FIGS. 2 to 4. The first and second flowpath members 6 and 7 are each made of a cylinder of an electrically insulating material, for example, Teflon (brand name of E. I. Du Pont de Nemours & Co. Inc.) and having at its one end a recess 61, 71 with a diameter slightly smaller than its outer diameter and a depth of the order of, for example, 1 mm. From the bottom of the recess 61, 71 to the other end extend axially a multiplicity of conduction holes 62, 72 having a small diameter of, for example, 1 mm or less.

Figure 3:
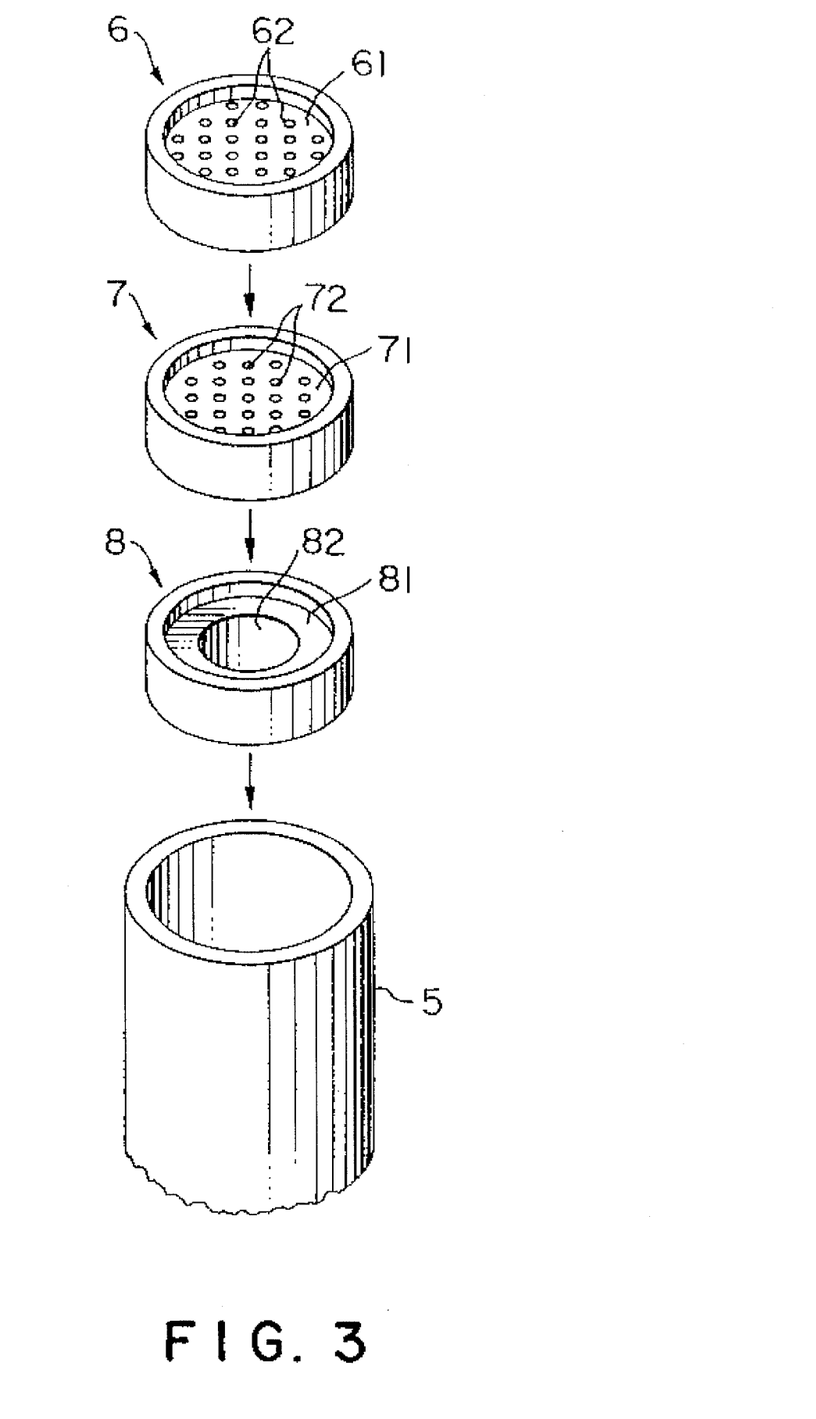
FIG. 3 is an exploded perspective view of flowpath members.
Figure 4:
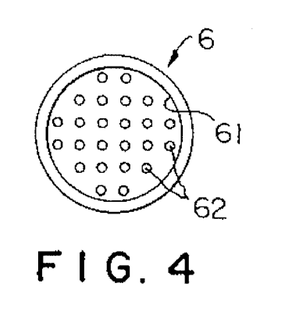
FIG. 4 is a top plan view of a first flowpath member.
Figure 5:
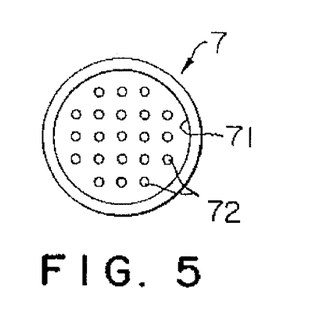
FIG. 5 is a top plan view of a second flowpath member.

The conduction holes 62 and 72 may be arranged along, for example, a plurality of circles concentric with the outer diameter of the flowpath members 6 and 7. However, the conduction holes 62 of the first flowpath member 6 differ in the arrangement pattern from the conduction holes 72 of the second flowpath member 7 so that when the flowpath members 6, 7 are axially aligned with each other, the positions of the holes 62 and 72 do not coincide, and in other words, when the second flowpath member 7 is viewed axially through the conduction holes 62, the conduction holes 72 cannot be seen.

Figure 6:
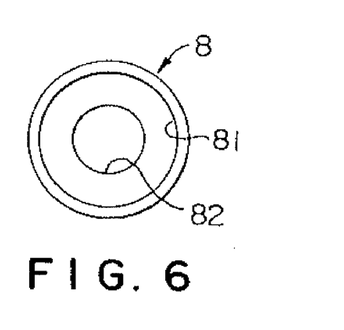
FIG. 6 is a top plan view of a third flowpath member.

The third flowpath member 8 is made of a cylinder of an electrically conducting material, for example, aluminum and having at its one end a recess 81 similar to the recess 61, 71. From the bottom of the recess 81 to the opposite end extends axially a conduction hole 82, for example, having the same diameter as the bore diameter of the gas supply conduit 5 located outside the vacuum treatment chamber 2.

Within the gas supply conduit 5 are inserted first flowpath members 6 and second flowpath members 7 alternately from the underside of the lower electrode 3 (the support 32) with their respective recesses 61, 71 facing upward. Further, a plurality of third flowpath members 8 are disposed in series below the vicinity of the interface between the electrically insulating member 4 and the grounded member 41, with their recesses 81 facing upward so as to be continuous with the arrangement of the flowpath members 6 and 7 and in close contact with the lowermost flowpath member 6 or 7. In this embodiment, the gas supply conduit 5 and the flowpath members 6 to 8 constitute backside gas flowpath means.

At a position vertically opposite to a semiconductor wafer W on the mount and above the chamber 2, as can be seen in FIG. 1, a permanent magnet 90 may be placed rotatably around an axis 91. The permanent magnet 90 is rotated to form a magnetic field in the vicinity of the semiconductor wafer W and parallel to the major surface thereof, thus constituting a magnetron etching apparatus.

The function of the above embodiment will be described below.

First, by means of a transfer arm not shown, a semiconductor wafer W which is an object to be treated is loaded into the vacuum treatment chamber 2 through the loading port g1 with the gate valve G1 opened, and is placed on the mount 31 whose temperature is regulated to be within a range of, for example, 10° C. to −100° C. by the cooling medium in the cooling medium reservoir 35 and a heater not shown. Then, the wafer W is attracted and fixed by an electrostatic chuck not shown, and the backside of the wafer W is subjected to He gas which is supplied through the gas supply conduit 5 and emitted from the gas emission holes 54 and whose pressure is controlled to, for example, about 10 Torr by the pressure control unit 55, whereby the temperature of the wafer W is made uniform.

The vacuum treatment chamber 2 is supplied with a treatment gas from the treatment gas supply conduit 23 through the holes in the gas ejection plate 22, while being evacuated by the vacuum pump 24 by way of the exhaust conduit 20 so as to maintain the pressure within the vacuum treatment chamber 2 at a predetermined value. Furthermore, a high-frequency electric power of, for example, 13.56 MHz, 1 KW derived from the high-frequency power source 43 is applied between the upper electrode 21 and the lower electrode 3 to produce a plasma for etching the wafer W. Afterwards, the vacuum treatment chamber 2 is evacuated by the exhaust pump 57 by way of the branch conduit 5B of the gas supply conduit 5 so as to prevent the wafer W from being blown off the mount 31 by the pressure of the backside gas remaining within the gas flow path, and then the electrostatic chuck is deenergized.

In conventional plasma treatment apparatus, the gas supply conduit 5 is comprised of a mere integral straight pipe, including the portion lying within the grounded member 41 and the electrically insulating member 4. With this conventional structure there is a fear of electrical discharge occurring between the lower electrode 3 and the grounded member 41 through the gas supply conduit 5. The reason will be described on points noticed by the inventors and experimental data. The relationship between the backside gas pressure and the electrical discharge start voltage can be expressed as an upwardly widening parabola curve, in coordinates with the axis of abscissas representing the gas pressure and the axis of ordinates representing the discharge start voltage. The shape of the curve depends on what kind of gas is used. If the above relationship is analyzed with the electrodes arranged on both ends of a conduit, the discharge start voltage is not much influenced by the length of the conduit as long as the length lies within a certain range, but is liable to be lower as the diameter of the conduit becomes larger.

Figure 8:
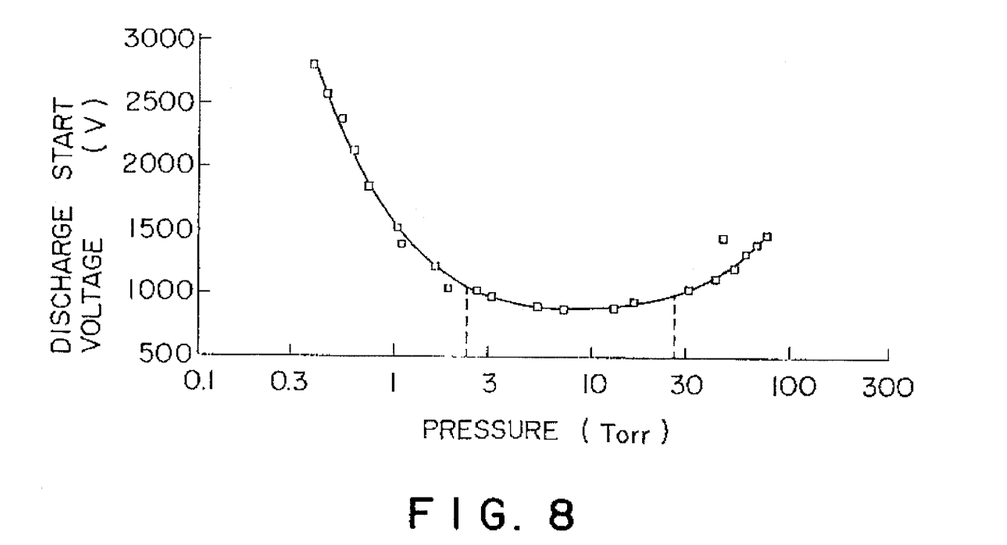
FIG. 8 is a characteristic diagram showing a relationship between a gas pressure within a backside gas supply conduit and a discharge start voltage in a conventional plasma etching apparatus.

Here, He gas being used as the backside gas is sealed into the conduit of 4 mm diameter while variously changing the gas pressure to examine the relationship between the pressure (Torr) and the discharge start voltage. FIG. 8 shows the results. In wafer etching apparatus, the high-frequency voltage and the He gas pressure are typically set at, for example, 1 KV and about 10 Torr, respectively. As can be seen from the characteristic curve shown in FIG. 8, the discharge start voltage is less than 1 KV at the pressure of 10 Torr. It is thus to be appreciated in the case of the use of only the gas supply conduit 5 that there are conditions readily causing an electrical discharge between the lower electrode 3 and the grounded member 41 through the He gas contained in the conduit 5.

Once such electrical discharge occurs, a predetermined electric power energy cannot be secured, and hence the etching rate is lowered. Thus, the result of the etching treatment may be insufficient if the electrical discharge is not detected. Further, unstabilized plasma may prevent the matching of impedance, and the electrical discharge may damage the gas supply conduit 5 and other components such as electrically conducting portions. Where the gas supply conduit 5 is made slender to lower the discharge start voltage, the conductance becomes small so that a considerable amount of time must be taken to suck the backside gas, resulting in a reduced throughput.

According to the present invention, the above problems can be solved by the provision of the flowpath members 6, 7. The portion of the gas supply conduit 5 circumscribed by the lower electrode 3 and the grounded member 41 having different potentials accommodates the flowpath members 6, 7 fitted thereinto so as to define a flow path for He gas having a small diameter of 1 mm or less. As a result, the curve representing the electrical discharge start voltage, shown in FIG. 8, is upwardly shifted, that is, the discharge start voltage for each pressure is increased. The reason why the discharge start voltage increases is supposed to be in that most of the electrons, when emitted, impinge against the wall and disappears due to the narrow gas flow path.

Since the conduction holes 62 of the first flowpath member 6 do not coincide in the arrangement pattern with the conduction holes 72 of the second flowpath member 7, the gas flow path is caused to bend at the transition from one flowpath member 6 (7) to the other flowpath member 7 (6) through the recesses 61, 71 each defining a buffer portion, whereby the electrons are more liable to impinge against the peripheral walls, thus making the discharge start voltage even higher.

A multiplicity of fine gas flow paths formed within the gas supply conduit 5 provide a large conductance as a whole, thus realizing a high-speed exhaust of the He gas when sucking the backside gas by way of the gas supply conduit 5 after deenergizing the electrostatic chuck, to thus prevent the throughput from lowering.

The reason why the third flowpath members 8 made of aluminum are provided at the lower side of the flowpath members 6, 7 is that otherwise there would be formed a gas flow path having a larger diameter in the region with an electric potential gradient. Thus, the insertion of the third flow path members 8 renders the lower side of the flowpath members 6, 7 equipotential with the grounded member 41, thereby securely preventing the occurrence of any electrical discharge.

Figure 9:
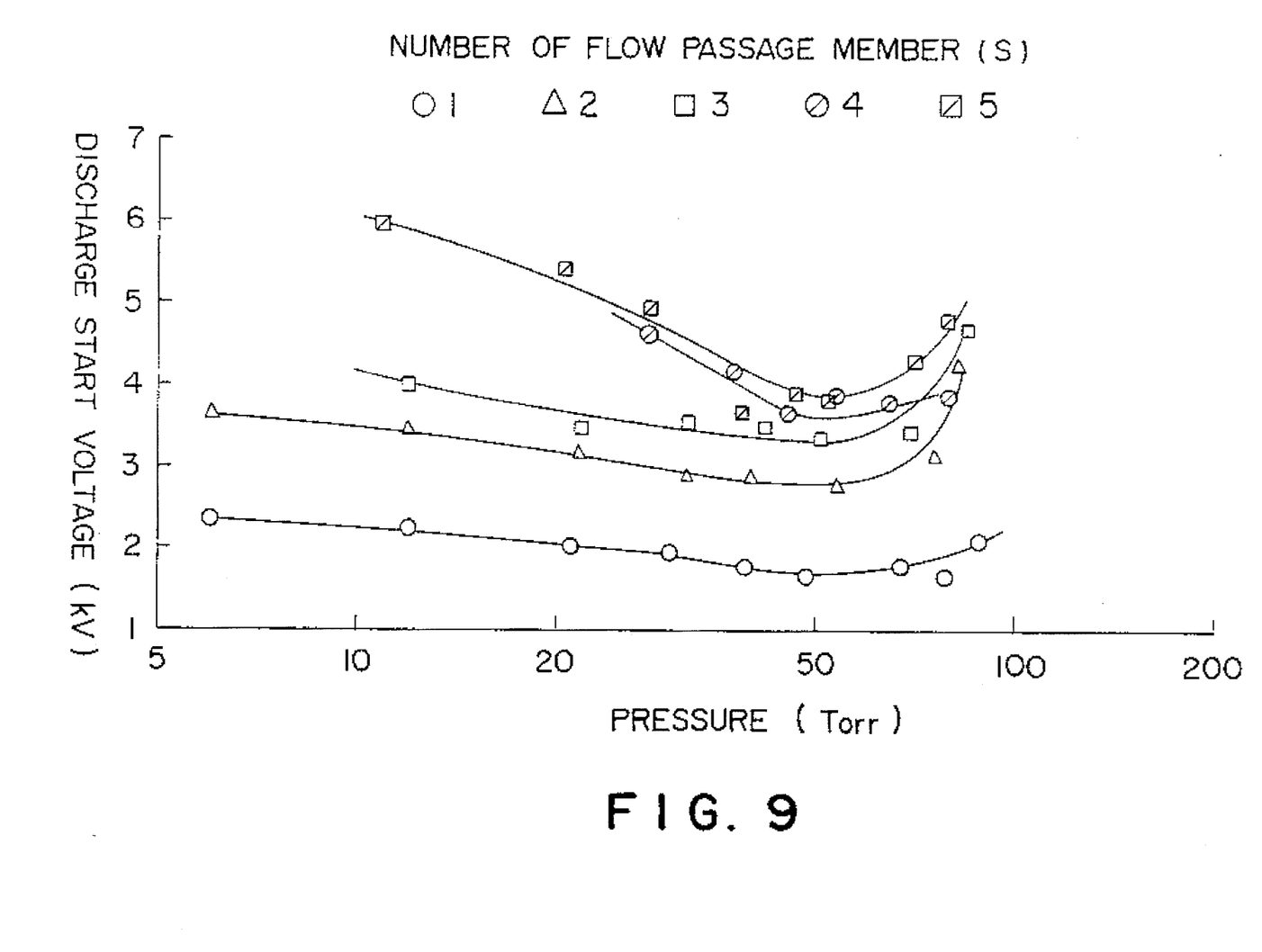
FIG. 9 is a characteristic diagram showing a relationship between the discharge start voltage and the backside gas pressure, with the number of flowpath members taken as a parameter.

The third flowpath member 8 may be replaced by the first and second flowpath members 6, 7, but too long a train of these members 6, 7 will reduce the conductance. Therefore, the arrangement of the flowpath members can be appropriately determined in view of the pressure of the backside gas, the thickness of the electrically insulating member 4 and so on. Here, to examine how the relationship between the gas pressure and the electrical discharge start voltage varies depending on the number of the flowpath members, the discharge start voltage was measured for each case of one to five flowpath members (6 or 7) while changing the pressure variously with the electrodes disposed on both ends. The results are shown in FIG. 9. Each flowpath member (6 or 7) was approximately 6 mm in length, and the conduction hole had a diameter of the order of 0.8 mm.

As can be seen from the results of FIG. 9, the electrical discharge start voltage becomes higher as the number of the flowpath members increases. For example, the discharge start voltage is higher than 1 KV at a pressure of 10 Torr. It will thus be understood that with two or more flowpath members the electrical discharge could be securely prevented even when the apparatus is set at 1 KV.

The flowpath member may be of an inseparable, elongated integral type. However, a combination of the individually segmented flowpath members as in the above embodiment enables the withstand voltage or conductance to be freely changed, thereby increasing the design freedom, allowing use of general-purpose components, conveniently permitting disassembly for maintenance, and enabling an easy assembly.

Figure 7:
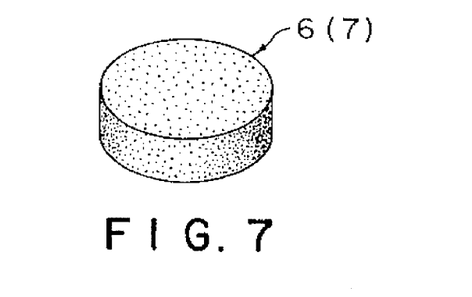
FIG. 7 is a perspective view showing a modification of the first and second flowpath members.

It is to be noted that the flowpath member may be of an inseparably integral type, and that the conduction holes of the flowpath members may have the same arrangement even in the case of a combination of separable flowpath members. Moreover, the flow path having a small diameter set forth above is not intended to be limited to a one extending in the axial direction of the gas supply conduit. For example, the flowpath member may be comprised of a porous body as shown in FIG. 7, for example, a cylinder made of porous ceramics. In this case, innumerable bent paths formed therewithin act as the flow paths.

The flowpath members 6, 7 and 8 described above can be provided at not only the position shown within the gas supply conduit 5 but also a position closer to the electrostatic chuck. For instance, they may be positioned in the region of the accumulator space 53.

The above-described plasma treatment apparatus may have a lower electrode connected to the ground and an upper electrode electrically coupled to the high-frequency power source. The principle of the present invention is applicable also to a plasma etching apparatus, as well as to a heat treatment apparatus such as a plasma CVD apparatus, an ashing apparatus and so on. The object to be treated is not limited to a wafer and, for example, an LCD substrate can also be treated.

Figure 10:
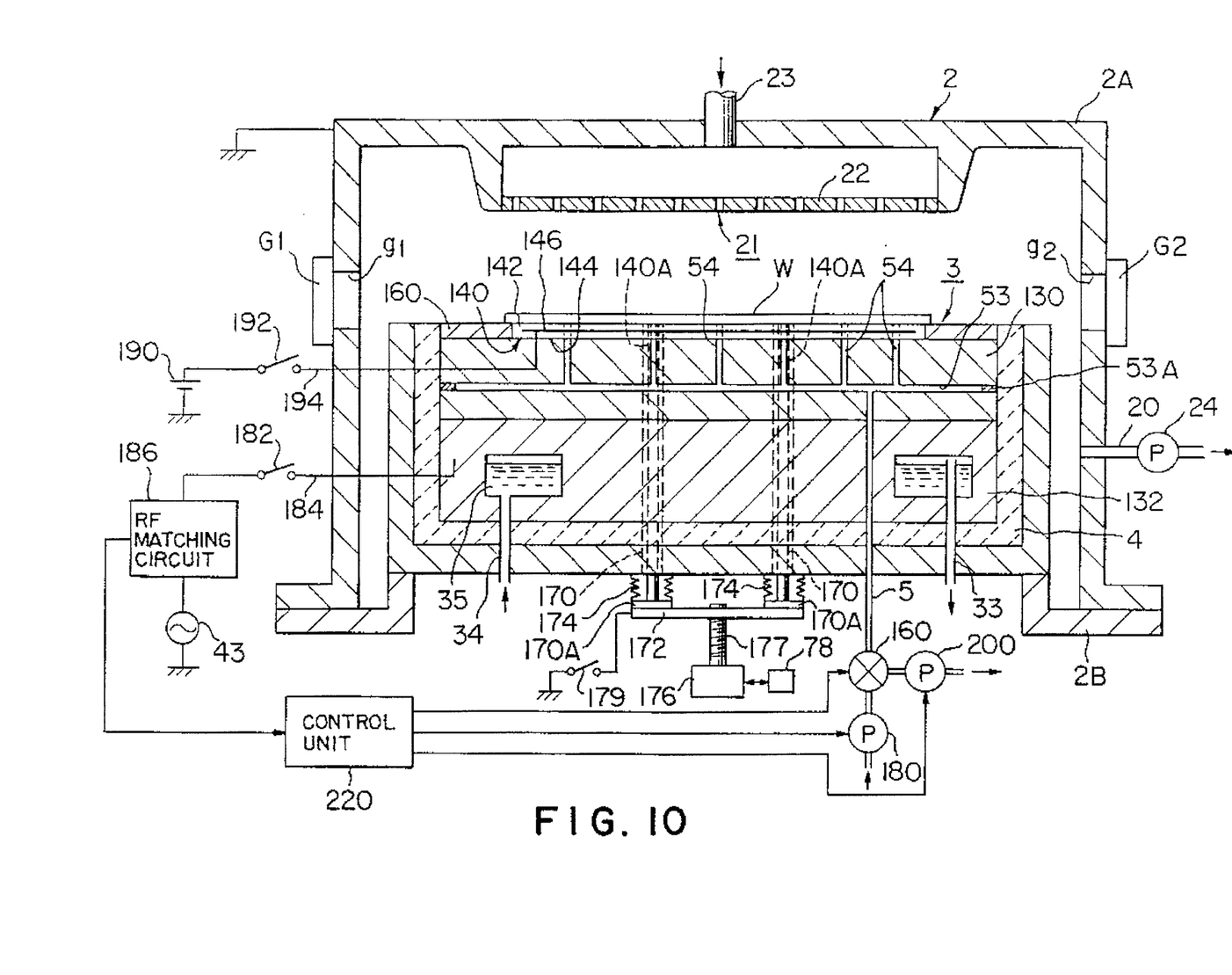
FIG. 10 is a vertical sectional view showing another embodiment of the present invention.
Figures 11, 11A:
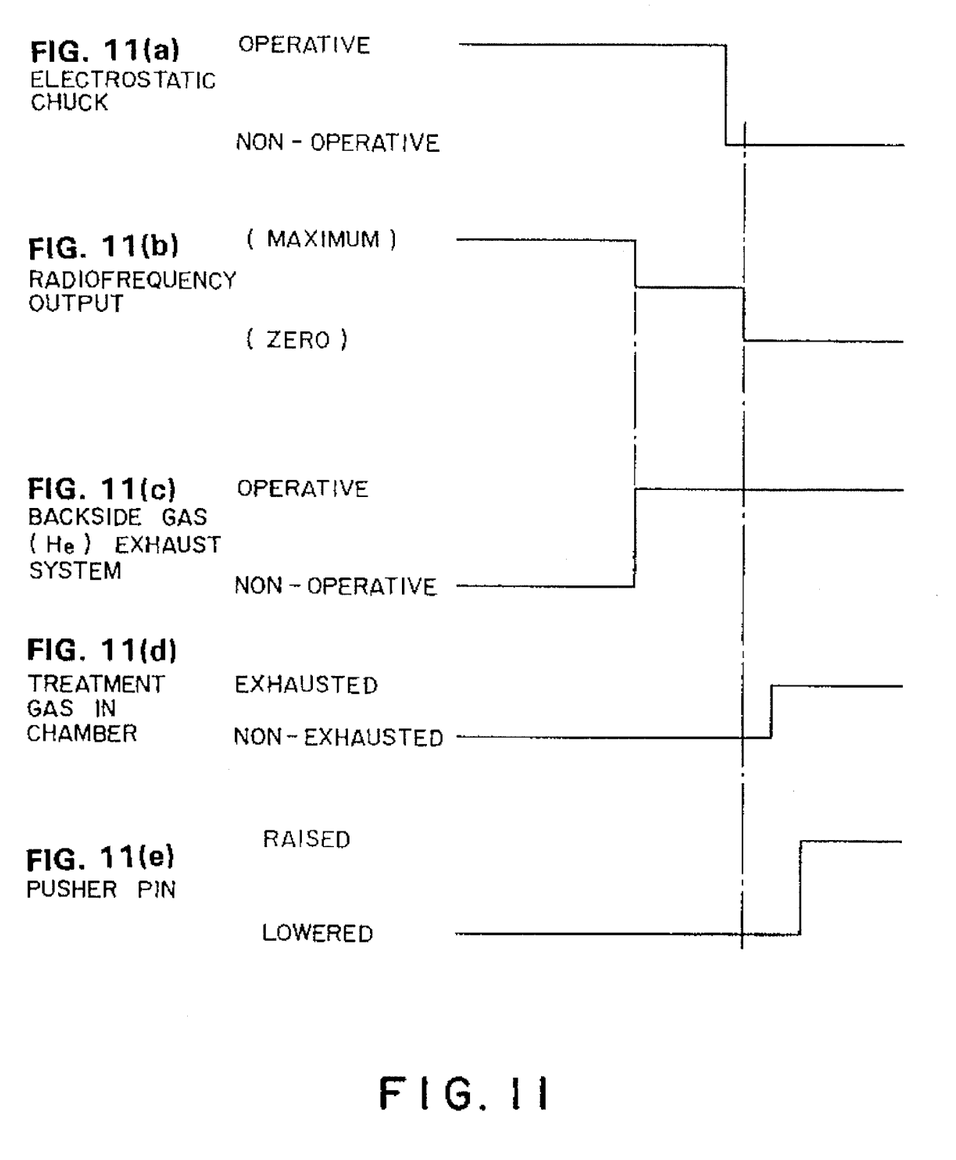
FIG. 11 is a timing chart for explaining the operation of a control unit shown in FIG. 10.

FIGS. 10 and 11 illustrate other improved features in the present invention. In FIG. 10, parts equivalent to those of the plasma treatment apparatus shown in FIG. 1 are designated by the same reference numerals.

A plasma treatment apparatus depicted in FIG. 10 comprises a vacuum treatment chamber 2 including an upper electrode 21 and a lower electrode 3 having a first susceptor 130 and a second susceptor 132. An electromagnetic chuck 140 is provided on the top surface of the first susceptor 130.

The vacuum treatment chamber 2 is constituted of a cylindrical upper part 2A having an open bottom and a cylindrical lower part 2B having a closed bottom and secured to the open bottom of the upper part 2A. The interior of the vacuum treatment chamber 2 is capable of being evacuated, and defines a space to be supplied with an etching gas. The lower part 2B accommodates therewithin an electrically insulating member 4 in the form of a bottomed cylinder made of ceramics. The first and second susceptors 130 and 132 are received within the interior of the electrically insulating member 4.

The first and second susceptors 130 and 132 are composed of vertically layered electrically conducting materials having a good thermal conductivity such as aluminum. Such separable structure ensures replacement of the overlying first susceptor 130 in accordance with the size of the semiconductor wafer W which is an object to be treated. Within the interior of the second susceptor 132 is provided a cooling medium reservoir 35 through which a cooling medium such as liquid nitrogen is circulated to thereby cool the semiconductor wafer W or the object to be treated to −50° to −100° C. by way of the first susceptor 130 and the electrostatic chuck 140.

The electrostatic chuck 140 fixedly mounted on the top surface of the first susceptor 130 lies within an opening formed in a known focus ring 160 resting on the top of the first susceptor 130. The electromagnetic chuck 140, as is well known, comprises upper and lower polyimide sheets 142 and 144 each serving as an electrically insulating layer, and an electrically conducting sheet 146 made of, for example, copper and interposed between the sheets 142 and 144. The electromagnetic chuck 140 has three holes 140A (only two holes are shown in FIG. 10) each extending in its thickness direction and receiving a pusher pin 170 which functions when placing the semiconductor wafer W.

The pusher pin 170 is an electrically conducting member, and is vertically displaceably inserted within a though-hole formed in the electromagnetic chuck 140 and the first and second susceptors 130 and 132. When the pusher pins 170 are raised, their upper ends protrudes upwardly from the electromagnetic chuck 140 to push up the semiconductor wafer W carried thereon. The lower ends 170A of the pusher pins 170 are firmly attached to an elevator plate 172, allowing the pusher pins 170 to be displaced in the vertical direction in FIG. 10 in response to the displacement of the elevator plate 172. In the case of this embodiment, bellows 174 are provided between the lower end 170A of the pusher pins 170 and the bottom surface of the lower chamber part 2B in such a manner that a vertical passage for the pusher pin 170 is hermetically sealed against the atmosphere.

The elevator plate 172 for raising and lowering the pusher pins 170 is coupled to, for example, a pulse motor 176 acting as a drive source, the rotational force derived from the pulse motor 176 being converted into a linear driving force for the elevator plate 176 by way of, for example, a transmission member such as a ball screw 177.

The pulse motor 176 receives pulses from the motor drive section 178 so that the former can be rotationally driven in compliance with the pulses. The pusher pins 170 can be selectively grounded by a switch 179 through the elevator plate 172. The grounding is established when the pusher pins 170 are pushed up to unload the semiconductor wafer W, thereby removing residual electric charge on the semiconductor wafer W.

The interior of the chamber 2 is evacuated to define a space allowing the introduction of an etching gas, that is, a plasma treatment space. Thus, the chamber upper part 2A is grounded, while the first and second susceptors 130 and 132 are electrically connected to a power supply line 184 for the supply of a high-frequency electric power from a high-frequency power source 43 through a switch 182, thereby providing a plasma etching apparatus of RIE (Reactive Ion Etching) type. By grounding the chamber upper part 2A, it is also used as the other electrode for the electromagnetic chuck so that upon the generation of a plasma the semiconductor wafer W can be grounded through the plasma.

The electromagnetic chuck 140 is further connected to a power supply circuit 194 for supplying a D.C. voltage, for example, of the order of 2 KV from a D.C. high-voltage power source 190 through a switch 192 to the electrically conducting sheet 146. Thus, the supply of a high-voltage to the electrically conducting sheet 146 allows operation of a so-called monopole type electrostatic chuck, thereby making it possible to attractingly hold the semiconductor wafer W on the electromagnetic chuck 140.

Although not shown, in the same manner as shown in FIG. 1, a permanent magnet may be rotatably provided at a position confronting the semiconductor wafer W and above the chamber upper part 2A so that the rotation of the permanent magnet permits a formation of a magnetic field in the vicinity of the semiconductor wafer W and parallel thereto, consequently providing a magnetron etching apparatus.

The electromagnetic chuck 140 for attractingly holding the semiconductor wafer W and the first susceptor 130 mounted with the electromagnetic chuck 140 are provided with a plurality of backside gas emission holes 54 extending parallel to the insertion holes for receiving the push pins 170. The gas emission holes 54 open into the electromagnetic chuck 140 and communicates with an accumulator space 53 formed within the interior of the first susceptor 130.

The accumulator space 53 is formed of, for example, a space extending across the first susceptor 130, whose outer periphery is sealed by a sealing member 53A. The accumulator space 53 is connected to a gas supply conduit 5 having on its way a directional control valve 160. The directional control valve 160 is coupled with two branch passages, one of which has a backside gas supply pump 180, the other having an exhaust pump 200. The operations of the directional control valve 160, gas supply pump 180, and exhaust pump 200 are controlled by a control unit 220 which will be described below.

The control unit 220 comprises essentially a microcomputer capable of arithmetic control operation, whose input side is connected to a high-frequency (RF) matching circuit 186, whose output side is connected through an I/O interface not shown to the directional control valve 160, supply pump 180, and exhaust pump 200. The control unit 220 executes the following operation.

He gas acting as a backside gas must be entirely removed at the time of evacuating the interior of the chamber 2 and unloading the semiconductor wafer W. This aims at preventing the water ingredient ($H_2O$) contained in the He gas from scattering from the electrostatic chuck 140 around the interior of the chamber 2 and at preventing the water from remaining on the attraction surface of the semiconductor wafer W.

The control unit 220 functions to set the timings of the operations of the directional control valve 160, supply pump 180, and exhaust pump 200 as depicted in the timing chart of FIG. 11. Referring now to FIG. 11, description will be given of a case of evacuating the interior of the chamber 2. In this case, the generation of plasma is brought into a stop. At that time, the output of the high-frequency power source is set to be reduced step by step, for example, from 800 W down to 80 W, and after a lapse of a given period of time to zero. With such stepwise reduction of the high-frequency output, the directional control valve 160 is changed over to the exhaust passage, and the exhaust pump 200 is actuated. Thus, He gas which has been filling the gas emission holes 54 and the accumulator space 53 is forcibly expelled to the outside by the exhaust pump 200. Such exhaust of He gas continues until the process proceeds to the next treatment.

The reason why the reduction in the output of the high-frequency power source 43 is stepwisely performed is to suppress the rise in temperature of the semiconductor wafer W and to remove the residual electric charge accumulated on the semiconductor wafer W. More specifically, since the thorough exhaust of He gas leads to the absence of a so-called heat transfer cooling medium for the semiconductor wafer W, excessive rise in temperature of the semiconductor wafer W can be prevented by stepwisely weakening the generation of plasma. An intermediate output value is generally selected from within a range of 20 to 120 W, and the period of time to continue this output is set at, for example, about four (4) seconds.

On the contrary, instantaneous stop of the high-frequency electric power would result in an unstable holding attraction of the semiconductor wafer W to the electrostatic chuck 140 since there is absence of plasma functioning to move the electric charge between the electromagnetic chuck 140 and the grounded electrode 21. For this reason, the stepwise reduction of the high-frequency output is employed to secure a stability of attractingly holding the semiconductor wafer W so as not to allow the semiconductor wafer W to float, thereby thoroughly removing the electric charge remaining on the semiconductor wafer W.

The deenergization of the electrostatic chuck 140 is timed slightly earlier than the timing to which the intermediate reduction of the high-frequency output has continued for a predetermined period of time. The start of the exhausting of the gas within the chamber 2 is timed slightly later than the timing to which the intermediate reduction of the high-frequency output has continued for a predetermined period of time. The start of push-up of the semiconductor wafer W by the pusher pins 170 is timed later than the timing when the evacuation starts within the chamber 2.

The operation of the apparatus will be described below. When the semiconductor wafer W is to be fixed by the electromagnetic chuck 140, the pusher pins 170 are first upwardly displaced, and the wafer W loaded into the chamber 2 from the outside is carried on the thus raised pusher pins 170. Then, when the pusher pins 170 are lowered, the wafer W is caused to be mounted on the electromagnetic chuck 140. Prior to mounting the wafer W, when the switch 192 is turned on, high voltage from the D.C. power source 190 is applied to the electromagnetic attraction sheet 146 of the electromagnetic chuck 140. As a result, the electromagnetic chuck 140 and the wafer W attract each other by the Coulomb force. Previous to attracting the wafer W, the control unit 220 issues a signal for changing over the directional control valve 160 to the gas supply passage. Upon the completion of the changeover of the directional control valve 160, the control unit 220 outputs a drive signal for activating the gas supply pump 180. Since the accumulator space 53 is filled with He gas, the latter is permitted to come into filling contact with the attraction surface of the electrostatic chuck 140 by way of the gas emission holes 54.

Meanwhile, as has been explained in FIG. 11, when the plasma treatment is executed and its entire process is complete, the high-frequency output is stepwisely reduced. This reduction is carried out, for example, by changing impedance in the high-frequency matching circuit 186. At that time, control unit 220 issues a signal for changing over the directional control valve 160 to the passage on the exhaust side, as well as a signal for activating the exhaust pump 200. As a result, He gas filling the accumulator space 53 and the passage extending from the space 53 toward the electromagnetic chuck 140 is forcibly exhausted to the outside by the exhaust pump 200.

The deenergization of the electromagnetic chuck 140 is timed earlier than the timing at which the high-frequency output is completely stopped after the stepwise reduction. Since He gas is not supplied onto the attraction surface of the electromagnetic chuck 140 at the time of deenergization of the electromagnetic chuck 140, there is no occurrence of the residual electric charge attributable to water contained in the He gas. Further, since the attraction surface is not supplied with He gas, there is no leakage of the He gas containing water into the chamber 2.

Although the He gas supply/exhaust structure for the accumulator space 53 in this embodiment employs the directional control valve 160 to selectively use one of the two gas flow passages, the present invention is not intended to be limited to such structure. It is conceivable, for example, that the gas supply conduit 5 is made to have branches without using any directional control valve, as shown in FIG. 1, to provide the two branch passages with a gas supply pump and a gas exhaust pump, respectively, so that the gas supply/exhaust can be performed by setting one of the pumps into operation.

It is to be appreciated that the present invention is applicable to other apparatus using a monopole type electrostatic chuck and executing a heat transfer by the supply of a cooling gas such as He gas between the object to be treated and the electromagnetic chuck, for example, a variety of plasma treatment apparatuses such as a plasma CVD apparatus or a sputtering deposition apparatus.

What is claimed is:

1. A plasma treatment apparatus comprising:

means constituting a vacuum treatment chamber;

an upper electrode and a lower electrode located within said vacuum treatment chamber so as to be spaced apart from each other;

means for supplying and exhausting a treatment gas into and from said vacuum treatment chamber;

a chuck provided on said lower electrode for holding an object to be treated;

high-frequency electric power supply means for supplying a high-frequency electric power between said upper and lower electrodes to generate in the treatment gas a plasma for treating said object being held by said chuck;

electrically conducting means associated with said lower electrode by way of electrically insulating means, said electrically conducting means having a potential different from that of said lower electrode;

backside gas supply means including a gas supply conduit for supplying a heat transfer backside gas, through said electrically conducting means and said electrically insulating means, to a backside of said object to be treated being held by said chuck on said lower electrode; and flowpath means made of an electrically insulating material and fitted in said gas supply conduit, said flowpath means having a multiplicity of flowpath holes which are formed in electrically insulating material of said flowpath means.

2. A plasma treatment apparatus according to claim 1, wherein:

said flowpath means comprises a plurality of flowpath elements divided in a longitudinal direction of said gas supply conduit.

3. A plasma treatment apparatus according to claim 1, wherein:

said flowpath means is of a cylindrical shape, and said flowpath holes extend longitudinally through the interior of the flowpath means.

4. A plasma treatment apparatus according to claim 3, wherein:

said flowpath means comprises a plurality of flowpath elements divided in a longitudinal direction of said gas supply conduit, and said flowpath holes of adjacent flowpath elements are offset positionally with one another with respect to the longitudinal direction thereof.

5. A plasma treatment apparatus according to claim 3, wherein:

said flowpath means comprises a plurality of flowpath elements divided in a longitudinal direction of said gas supply conduit, and each of said flowpath elements includes at its surface in contact with an adjacent flowpath element a recess having a diameter slightly smaller than the outer diameter of each element; and wherein:

said flowpath holes are formed in the region of said recess.

6. A plasma treatment apparatus according to claim 1, wherein:

said flowpath means comprises a porous body.

7. A plasma treatment apparatus according to claim 1, further comprising:

electrically conducting flowpath means fitted in said gas supply conduit so as to abut against said flowpath means at the side of said backside gas supply means.

8. A plasma treatment apparatus according to claim 7, wherein:

said electrically conducting flowpath means is in the form of a cylinder having a flowpath hole in its central portion.

9. A plasma treatment apparatus according to claim 1, wherein said flowpath means of electrically insulating material is positioned in the vicinity of said electrically insulating means.

10. A plasma treatment apparatus according to claim 1, wherein:

said backside supply means further includes:

supply pump means for supplying a backside gas onto the backside of said object to be treated by way of said gas supply conduit; and exhaust pump means for exhausting the backside gas from said backside of said object by way of said gas supply conduit.

11. A plasma treatment apparatus comprising:

means constituting a vacuum treatment chamber;

an upper electrode and a lower electrode located within said vacuum treatment chamber so as to be spaced apart from each other;

means for supplying and exhausting a treatment gas into and from said vacuum treatment chamber;

an electrostatic chuck provided on said lower electrode for holding an object to be treated;

high-frequency electric power supply means for supplying a high-frequency electric power between said upper and lower electrodes to generate in the treatment gas a plasma for treating said object being held by said chuck;

electrically conducting means associated with said lower electrode by way of electrically insulating means, said electrically conducting means having a potential different from that of said lower electrode; and backside gas supply means including a gas supply conduit for supplying a heat transfer backside gas, through said electrically conducting means and said electrically insulating means, directly to a backside of said object to be treated being held by said chuck on said lower electrode;

said backside gas supply means further including supply pump means for supplying a backside gas onto the backside of said object by way of said gas supply conduit, exhaust pump means for exhausting the backside gas from said backside of said object by way of said gas supply conduit, and control means for actuating said supply pump means in relation to an operation of said high-frequency electric power supply means and for actuating said exhaust pump means in relation to a lowering of power in said high-frequency electric power supply means.

12. A plasma treatment method comprising the steps of:

placing an object to be treated on an electrostatic chuck provided on a lower electrode within a vacuum treatment chamber, and thereby electrostatically holding the object;

introducing a treatment gas into said vacuum treatment chamber;

Supplying a high-frequency electric power between an upper electrode and said lower electrode within said vacuum treatment chamber to produce in said treatment gas a plasma to thereby plasma-treat said object;

supplying a heat transfer backside gas through said lower electrode to a backside of said object being held on said lower electrode, during the plasma treatment;

exhausting said backside gas from the backside of said object to be treated, after completion of said plasma treatment;

stepwisely reducing the supply of the high-frequency electric power upon the completion of said plasma treatment step; and evacuating said vacuum treatment chamber of said treatment gas; and said step of exhausting the backside gas is initiated in unison with a first reduction stage in the stepwise reduction of the high-frequency electric power.

13. A plasma treatment apparatus comprising:

means constituting a vacuum treatment chamber;

an upper electrode and a lower electrode located within said vacuum treatment chamber so as to be spaced apart from each other;

means for supplying and exhausting a treatment gas into and from said vacuum treatment chamber;

an electrostatic chuck provided on said lower electrode for holding an object to be treated;

high-frequency electric power supply means for supplying a high-frequency electric power between said upper and lower electrodes to generate in the treatment gas a plasma for treating said object being held by said chuck;

electrically conducting means associated with said lower electrode by way of electrically insulating means, said electrically conducting means having a potential different from that of said lower electrode; and backside gas supply means including a gas supply conduit for supplying a heat transfer backside gas, through said electrically conducting means and said electrically insulating means, directly to a backside of said object to be treated being held by said chuck on said lower electrode;

said backside gas supply means further including flow changeover means provided in said gas supply conduit, supply pump means for supplying a backside gas onto the backside of said object by way of said flow changeover means and said gas supply conduit, a number of backside gas holes connecting said gas supply conduit and the backside of said object, exhaust pump means for exhausting the backside gas from said backside of said object by way of said gas supply conduit and said flow changeover means, and control means for actuating said supply pump means in relation to an operation of said high-frequency electric power supply means and for actuating said exhaust pump means in relation to a lowering of power in said high-frequency electric power supply means.

14. A plasma treatment method comprising the steps of:

placing an object to be treated on an electrostatic chuck provided on a lower electrode within a vacuum treatment chamber, and thereby electrostatically holding the object;

introducing a treatment gas into said vacuum treatment chamber;

supplying a high-frequency electric power between an upper electrode and said lower electrode within said vacuum treatment chamber to produce in said treatment gas a plasma to thereby plasma-treat said object;

supplying a heat transfer backside gas through said lower electrode to a backside of said object being held on said lower electrode, during the plasma treatment;

exhausting said backside gas from the backside of said object to be treated, after completion of said plasma treatment;

stepwisely reducing the supply of the high-frequency electric power upon the completion of said plasma treatment step; and evacuating said vacuum treatment chamber of said treatment gas.

15. The plasma treatment apparatus as recited in claim 11 wherein said lowering of power is a complete shut off of power provided by said high-frequency electric power supply means.

16. A plasma treatment apparatus comprising:

means constituting a vacuum treatment chamber;

an upper electrode and a lower electrode located within said vacuum treatment chamber so as to be spaced apart from each other;

means for supplying and exhausting a treatment gas into and from said vacuum treatment chamber;

an electrostatic chuck provided on said lower electrode for holding an object to be treated;

high-frequency electric power supply means for supplying a high-frequency electric power between said upper and lower electrodes to generate in the treatment gas a plasma for treating said object being held by said chuck;

electrically conducting means associated with said lower electrode by way of electrically insulating means, said electrically conducting means having a potential different from that of said lower electrode; and backside gas supply means including a gas supply conduit for supplying a heat transfer backside gas, through said electrically conducting means and said electrically insulating means, directly to a backside of said object to be treated being held by said chuck on said lower electrode;

said backside gas supply means further including supply pump means for supplying a backside gas onto the backside of said object by way of said gas supply conduit, exhaust pump means for exhausting the backside gas from said backside of said object by way of said gas supply conduit, and control means for actuating said supply pump means in relation to an operation of said high-frequency electric power supply means and for actuating said exhaust pump means in relation to a lowering of power in said high-frequency electric power supply means, and wherein said lowering of power is a stepwise reduction in power provided by said high-frequency electric power supply means.

* * * * *